United States Patent [19]

Keller et al.

[11] Patent Number: 4,587,497
[45] Date of Patent: May 6, 1986

[54] LOW-POWER LOW-HARMONIC TRANSISTOR OSCILLATOR

[75] Inventors: Anthony F. Keller, Chicago; Dennis F. Marvin, Roselle, both of Ill.

[73] Assignee: Motorola, Inc., Schaumburg, Ill.

[21] Appl. No.: 685,424

[22] Filed: Dec. 24, 1984

[51] Int. Cl.[4] .......................... H03B 5/32; H03B 5/36
[52] U.S. Cl. .................. 331/116 R; 331/158
[58] Field of Search ............ 331/116 R, 116 FE, 158, 331/159

[56] References Cited

U.S. PATENT DOCUMENTS

| | | | |
|---|---|---|---|
| 2,745,010 | 5/1956 | Stansel | 250/36 |
| 3,427,568 | 2/1969 | Bath | 331/116 R |
| 3,697,983 | 10/1972 | Potter | 331/116 R X |
| 3,832,653 | 8/1974 | Nugent et al. | 331/116 R |
| 3,845,410 | 10/1974 | Steel | 331/116 R |
| 3,958,190 | 5/1976 | Minch | 331/116 R |
| 4,001,724 | 1/1977 | Keller | 331/116 R |
| 4,376,918 | 3/1983 | Masuda et al. | 331/116 FE |
| 4,387,349 | 6/1983 | Rapp | 331/116 FE |
| 4,405,906 | 9/1983 | Luscher | 331/116 FE |
| 4,459,565 | 7/1984 | Leach | 331/116 FE |

FOREIGN PATENT DOCUMENTS

| | | | |
|---|---|---|---|
| 0095405 | 7/1980 | Japan | 331/116 R |
| 1350920 | 4/1974 | United Kingdom | 331/116 R |
| 0678632 | 8/1979 | U.S.S.R. | 331/116 R |

Primary Examiner—Eugene R. LaRoche
Assistant Examiner—D. C. Mis
Attorney, Agent, or Firm—Donald B. Southard; Edward M. Roney

[57] ABSTRACT

A low current oscillator/buffer amplifier configuration is disclosed which provides a simple, inexpensive, low power oscillator with reduced harmonic output. Buffer 60 is coupled to the resonant tank circuit 58 of oscillator 50 by means of impedance transform network 70. This technique of tapping directly from the tank provides a buffered output signal having low harmonic content. Furthermore, impedance transform network 70 permits coupling feedback amplifier 52 to buffer amplifier 62 in a totem-pole amplifier stage configuration. This feature provides a significant current savings over conventional oscillator/buffer circuits. The instant invention is particularly well adapted for use as reference frequency oscillators in portable radio applications.

14 Claims, 4 Drawing Figures

LOW-POWER LOW-HARMONIC TRANSISTOR OSCILLATOR

BACKGROUND OF THE INVENTION

The present invention relates generally to the field of oscillators, and in particular, to oscillator/buffer amplifier circuits which exhibit low power consumption and low harmonic output.

Crystal controlled oscillators, such as Colpitts oscillators and the like, are commonly used to provide a highly stable reference frequency for a wide variety of radio communications equipment. These reference oscillators must conform to strict performance specifications including, among others, temperature stability, aging, load isolation, frequency adjustment range, and output distortion. Portable radio applications, however, further impose the significant requirement of low power consumption. It is very important that all portable radio circuitry, including reference oscillators, be optimized for minimum current consumption to extend battery life. Furthermore, portable applications present severe size and cost limitations to the oscillator design. Typical prior art crystal oscillators comply with the frequency stability, temperature stability, frequency adjustment range, and load isolation criteria, yet fail to address this need for a simple, inexpensive, low power reference oscillator with reduced harmonic content.

Nugent et al., for example, in U.S. Pat. No. 3,832,653 entitled "Low Noise RF Signal Generator" incorporates three additional inductor-capacitor (L-C) filter networks into a Colpitts oscillator/common-base (C-B) buffer circuit to reduce oscillator noise and suppress harmonic output. This method of adding supplementary L-C filter components to the output buffer circuitry precludes usage in portable radio applications, since the utilization of each supplementary component introduces the issue of reliability, as well as contradicts the aforementioned size-minimization and cost-reduction goals.

Minch, however, in U.S. Pat. No. 3,958,190 entitled "Low Harmonic Crystal Oscillator" incorporates the common-base buffer stage directly into the oscillator tank circuit. The oscillator crystal itself acts as a very narrow bandpass filter to the currents in the tank circuit. Since the emitter-base junction of the C-B buffer stage is now included as part of the tank, and seeing that the C-B buffer transistor is biased to operate linearly, very few harmonics are coupled to the output. This approach complies with the size and cost restrictions of portable applications, because the supplementary L-C filter components in the output stage are no longer necessary. Nevertheless, the problem of increased power dissipation remains, due to the fact that the output buffer stage approximately doubles the current drain of the oscillator circuit itself.

A need, therefore, exists for a low power oscillator circuit with reduced harmonic output that avoids the additional bulk, expense, complexity, and unreliability of supplementary harmonic filter components.

SUMMARY OF THE INVENTION

Accordingly, it is an object of the present invention to provide an improved and simplified oscillator which overcomes the aforementioned deficiencies.

A more particular object of the present invention is to provide an improved oscillator/buffer amplifier circuit with minimized power consumption.

It is a further object of the present invention to provide an improved oscillator/buffer amplifier circuit with reduced output distortion.

Yet another object of the present invention is to provide an improved oscillator/buffer amplifier circuit having reduced size and cost.

In practicing the invention, the oscillator/buffer amplifier is configured such that the output of the oscillator is taken from the oscillator tank circuit and fed by way of an impedance transforming network to the linearly-operating buffer amplifier stage. The oscillator tank circuit then acts as a very narrow bandpass filter at the fundamental frequency of the oscillator, thus providing a very low harmonic output. Furthermore, the output buffer amplifier stage is connected in a "totem pole" configuration such that the buffer amplifier primary direct current is shared with the primary direct current of the oscillator amplifier. This "totem pole" configuration allows for a significant reduction in the DC bias current of the total oscillator/buffer, thus providing an extremely power-efficient circuit. It is with the impedance transforming network that these two concepts—feeding the buffer amplifier stage directly from the oscillator tank circuit, and implementing the "totem pole" amplifier configuration—can be combined in the present invention to achieve a simple, small, inexpensive oscillator circuit with high performance specifications and low power consumption.

The present invention can be utilized with various types of oscillators, such as, for example, Colpitts, Pierce, Hartley, or Clapp, as well as various configurations of output buffer amplifier stages, such as, for example, common-base, common-emitter, or common-collector (emitter-follower). Furthermore, the invention can be utilized in numerous oscillator applications, such as for reference oscillators, modulated oscillators, voltage-controlled oscillators, etc.

BRIEF DESCRIPTION OF THE DRAWINGS

The features of the present invention which are believed to be novel are set forth with particularity in the appended claims. The invention itself, however, together with further objects and advantages thereof, may best be understood by reference to the following description when taken in conjunction with the accompanying drawings, in which:

DETAILED DESCRIPTION

Figure 1:
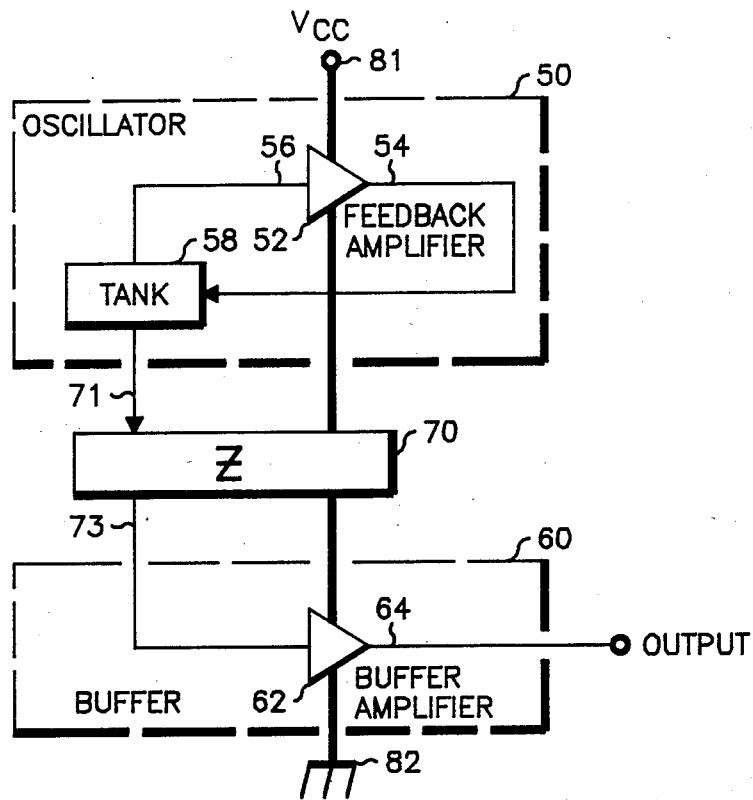
FIG. 1 is a block diagram of an embodiment of the present invention having an oscillator and buffer amplifier circuit with the totem-pole amplifier configuration.

Referring now to the drawings, FIG. 1 is a block diagram of an oscillator and buffer arrangement showing the totem-pole amplifier stage configuration of the present invention. For the purposes of clarity and simplicity, FIG. 1 has been divided into three functional groups; oscillator 50; buffer 60; and impedance transform network 70. The totem-pole amplifier configuration is also illustrated in FIG. 1.

Oscillator 50 performs the frequency generation function and is comprised of feedback amplifier 52 and resonant tank circuit 58. Feedback amplifier 52 has both input 56 and output 54 coupled to resonant tank circuit 58 to provide regenerative feedback to sustain oscillation. The active element of amplifier 52 may be one of numerous types, such as, for example, a bipolar transistor (either PNP or NPN), a field-effect transistor (either N-channel or P-channel), or other amplifying device such as an operational amplifier. Resonant tank circuit 58, which may be comprised of an inductor-capacitor (L-C) resonant circuit or a piezoelectric crystal device, provides the frequency determining function for the oscillator. Oscillator 50 may be configured as a Colpitts-type oscillator, as shown in the following figures, or may be configured as a Pierce, Hartley, or Clapp oscillator for particular applications. Moreover, oscillator 50 may include additional circuitry for temperature compensation, frequency adjustment, or frequency modulation.

Buffer 60 provides the signal amplification and load isolation functions for the oscillator circuit. A buffer amplifier stage is typically attached to an oscillator circuit to amplify the oscillator signal (voltage or current amplification), to match the oscillator output to a low impedance load, and to isolate the oscillator from varying load conditions. Buffer 60 consists solely of buffer amplifier 62, having input 73 coupled to resonant tank circuit 58 through impedance transform network 70, and having output 64 providing the oscillator output signal to a load. Buffer amplifier 62 may be configured as one of numerous types of amplifier stages. More specifically, it will subsequently be shown that buffer amplifier stage 62 can be embodied in a common-base (C-B), common-emitter (C-E), or common-collector (C-C) configuration. Furthermore, the active element of amplifier 62 may be a bipolar transistor, a field-effect transistor, or an operational amplifier.

An important feature of buffer 60 is that the input to the buffer is derived from resonant tank circuit 58 rather than from feedback amplifier 52. Conventional oscillator circuits provide an oscillator output to a load, or to a buffer stage, by means of the feedback amplifier device. In other words, the oscillator output signal is typically obtained from an output terminal of the active element, such as from the transistor collector of a Colpitts oscillator. Since the Colpitts transistor generally operates as a nonlinear amplifier, harmonics of the fundamental frequency are introduced into the output. If, however, the oscillator output signal is derived directly from the resonant tank circuit itself, the signal obtained has a relatively harmonic-free spectrum. The resonant tank circuit acts as a very narrow bandpass filter centered at the fundamental frequency, thereby significantly reducing the harmonic content of the signal obtained directly from the tank. Since buffer amplifier 62 operates in the linear range, the oscillator signal provided at output 64 similarly has a low harmonic content.

Impedance transform network 70 provides the necessary impedance matching which allows buffer amplifier 62 to be coupled to resonant tank circuit 58. Impedance transform network 70 permits tapping off the high-Q tank circuit to obtain a low harmonic signal without significantly degrading the Q of the tank. Depending on the particular configuration of the buffer amplifier stage, the impedance transform network may be required to provide a specific impedance match at a particular frequency, may be required to provide an AC ground at all frequencies, or may simply be required to provide direct coupling from input 71 to buffer amplifier input 73. Thus, impedance transform network 70 is individually configured to provide the proper impedance match between the resonant tank circuit 58 and the buffer amplifier 62.

Impedance transform network 70 also provides the proper DC biasing for the totem-pole amplifier arrangement. The totem-pole configuration of the amplifier stages permits a significant power savings advantage over a conventional oscillator/buffer circuit. FIG. 1 illustrates this totem-pole arrangement. Feedback amplifier 52 and buffer amplifier 62 are connected such that a singular primary direct current path exists from supply voltage 81, through amplifier 52, impedance transform network 70, and amplifier 62, to DC ground 82. (Primary direct current is the main output bias current of the amplifier, such as the collector-emitter bias current of a bipolar transistor, as distinguished from secondary direct current, such as the transistor base bias current.) The totem-pole amplifier arrangement reduces the total DC current consumption of the oscillator/buffer circuit to approximately one-half of the current otherwise required. Given a specific supply voltage requirement, this current savings translates into a significant power savings which is of utmost importance in portable radio applications.

In review, FIG. 1 illustrates the block diagram of the oscillator/buffer circuit according to the present invention. Buffer 60 is coupled to the resonant tank circuit 58 of oscillator 50 by means of impedance transform network 70. This technique of tapping directly from the tank provides a buffered output signal having low harmonic content. Furthermore, impedance transform network 70 permits coupling feedback amplifier 52 to buffer amplifier 62 in a totem-pole amplifier stage configuration. This feature provides a significant current savings over conventional oscillator/buffer circuits. Thus, the present invention provides a low-power low-harmonic oscillator particularly well adapted for use in portable radio applications.

Figure 2:
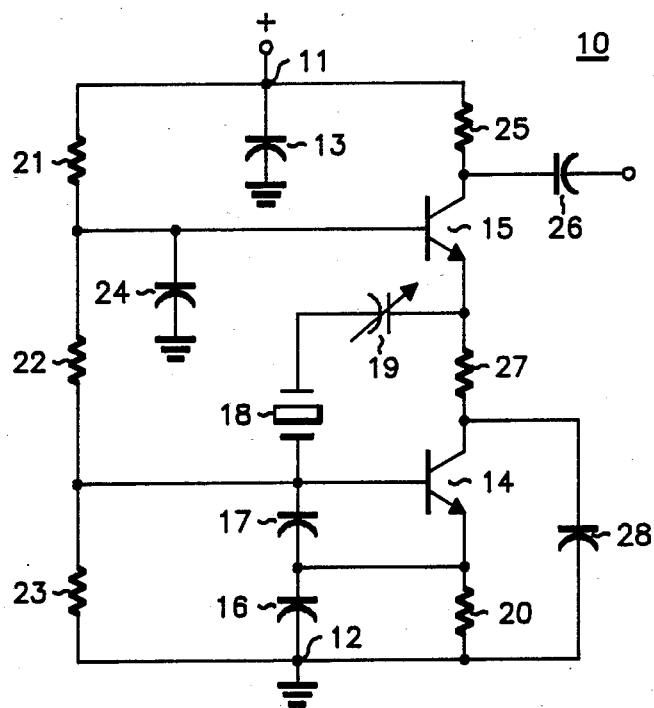
FIG. 2 is a schematic representation of an embodiment of the present invention configured as a Colpitts oscillator with a common-base buffer amplifier stage.

FIG. 2 is a schematic of one embodiment of the invention. The crystal oscillator/buffer amplifier 10 is comprised, in this instance, of a Colpitts oscillator coupled to a common-base buffer amplifier in a totem-pole transistor configuration.

The Colpitts oscillator includes a feedback amplifier and a resonant tank circuit. Transistor 14, the active element of the oscillator feedback amplifier, is an NPN silicon transistor with base, emitter, and collector terminals. The DC bias for the base is derived from base bias resistors 21, 22, and 23 connected in series from supply voltage 11 to ground 12. The base of transistor 14 is connected to the junction of resistors 22 and 23 as well as to the tank circuit. Capacitor 13, connected from supply voltage 11 to ground, serves as an RF bypass for the supply. The crystal oscillator tank circuit is comprised of the series combination of capacitor 16, capacitor 17, quartz crystal 18 and trimmer capacitor 19. Capacitor 16 is connected between transistor 14 emitter and ground. Capacitor 17 is connected from the base to emitter of transistor 14. In a typical Colpitts oscillator configuration, the series combination of quartz crystal 18 and trimmer capacitor 19 would be connected from the base of transistor 14 to ground. In the present embodiment, however, the series combination of quartz crystal 18 and trimmer capacitor 19 is connected from the base of transistor 14 to the low impedance input of the common-base amplifier. Thus, the impedance transform network 70 in the C-B buffer amplifier simply serves to directly couple the tank circuit to the buffer amplifier.

The buffer amplifier transistor 15, having base, emitter, and collector terminals, has the emitter terminal configured as the input to the common-base amplifier. DC bias for the base of transistor 15 is obtained from the junction of base bias resistors 21 and 22. Capacitor 24, connected from the base of transistor 15 to ground, provides an AC ground for the C-B amplifier. The output of the buffer amplifier is taken from the collector of transistor 15 through output coupling capacitor 26.

Transistor 14 and transistor 15 are arranged in a totem-pole configuration. Bias resistor 25 is connected from supply voltage 11 to the collector of transistor 15. Bias resistor 27 is connected from the emitter of transistor 15 to the collector of transistor 14. Similarly, bias resistor 20 is connected from the emitter of transistor 14 to ground 12. Bypass capacitor 28, connected from the collector of transistor 14 to ground, provides an AC ground for the Colpitts oscillator transistor. (The further significance of bias resistor 27 and bypass capacitor 28 will subsequently be discussed.) The totem-pole arrangement allows for a single collector-emitter current path for both transistors.

In prior art oscillators of the Colpitts type, the output of the oscillator is usually obtained from the collector of transistor 14. This transistor operates as a nonlinear amplifier such that harmonics are present at the collector. Since the output is normally obtained from this nonlinear device, additional L-C filtering becomes necessary to provide the required harmonic distortion level.

The circulating currents in the tank circuit, however, are relatively free of harmonics. When the output of the Colpitts oscillator is obtained from the tank circuit directly, the output will be substantially free of harmonics. The low impedance input of the common-base buffer amplifier stage (transistor 15 emitter) is connected directly to the Colpitts oscillator tank circuit at trimmer capacitor 19. This low impedance input provides the required low impedance current path to ground to complete the tank circuit loop.

The totem-pole configuration of transistors 14 and 15 allows for a single primary current path through both transistors. This feature provides the low current advantage of the present invention. The DC current in this totem-pole configuration is reduced to approximately one-half of the current requirements of prior art oscillator/buffer circuits.

Since the input impedance of the common-base amplifier is very low (approximately $V_T/I_E$—or on the order of 25 ohms), the impedance transform network 70 to the C-B stage is simply comprised of bypass capacitor 24, bias resistor 27 and bypass capacitor 28. Bypass capacitor 24 provides an AC ground for the common-base amplifier. Resistor 27, connected between the emitter of buffer amplifier transistor 15 and the collector of the Colpitts oscillator transistor 14, provides the necessary impedance to isolate the C-B buffer amplifier input from AC ground. Capacitor 28 presents this AC ground at the collector of oscillator transistor 14. Additionally, this R-C filter provides a filtered DC emitter current for the buffer stage transistor 15. The distorted oscillator signal generated in the collector of transistor 14 is bypassed to ground, while the circulating tank current is injected into the emitter of the buffer amplifier. The value of capacitor 28 is chosen to provide an AC ground at all frequencies of interest. The value of resistor 27 is chosen sufficiently high to minimize loading effects on input signal level, yet low enough to provide sufficient DC bias currents in the C-B amplifier. In the present embodiment, resistor 27 is on the order of 150 ohms.

Thus, FIG. 2 shows one embodiment of the present invention as a Colpitts oscillator/common-base buffer arrangement. The technique of obtaining the buffer input signal from the resonant tank circuit provides a low harmonic output. The totem-pole amplifier stage configuration allows for a low power oscillator circuit.

Figure 3:
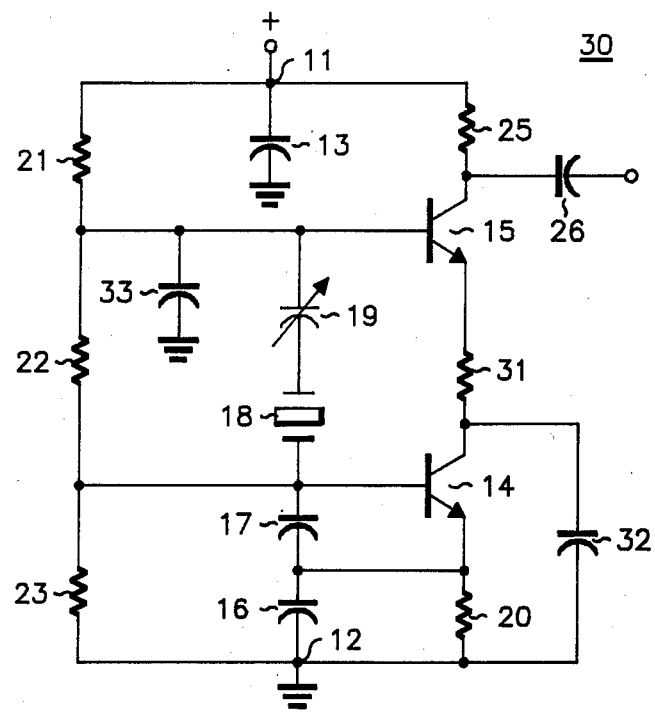
FIG. 3 is a schematic representation of a variation of the embodiment of FIG. 2, in which a Colpitts oscillator is coupled to a common-emitter buffer amplifier.

FIG. 3 is a similar configuration of a crystal oscillator/buffer amplifier circuit 30 illustrating a second embodiment of the present invention. This diagram shows a Colpitts crystal oscillator with a totem-pole buffer stage configured as a common-emitter amplifier. The output of the Colpitts oscillator is again obtained from the tank circuit by way of trimmer capacitor 19. In this embodiment, however, the common-emitter amplifier input impedance is too high to provide a ground return path for the circulating tank current. Thus, the impedance transform network 70 of the Colpitts oscillator/common-emitter buffer must furnish the resonant tank circuit with a low impedance without excessively loading the input signal.

The impedance transform network solves this problem with the addition of capacitor 33 from the base of buffer amplifier transistor 15 to ground. Thus, impedance transform network 70 for the C-E buffer arrangement consists of capacitor 33, capacitor 32, and resistor 31. Capacitor 33 provides the required reactance at the predetermined oscillator frequency such that a return path to ground is provided for the tank circuit. The value of capacitor 33 is specifically chosen to provide a predetermined reactance (on the order of 50 ohms for a 14.4 MHz oscillator) for the tank circuit loop. Bypass capacitor 32 serves the same function as bypass capacitor 28 of FIG. 2 by providing an AC ground at the collector of oscillator transistor 14. Resistor 31 serves the additional purpose of providing degenerative feedback for the buffer amplifier to maintain a good quality sine wave output voltage at the collector of buffer amplifier transistor 15.

Figure 4:
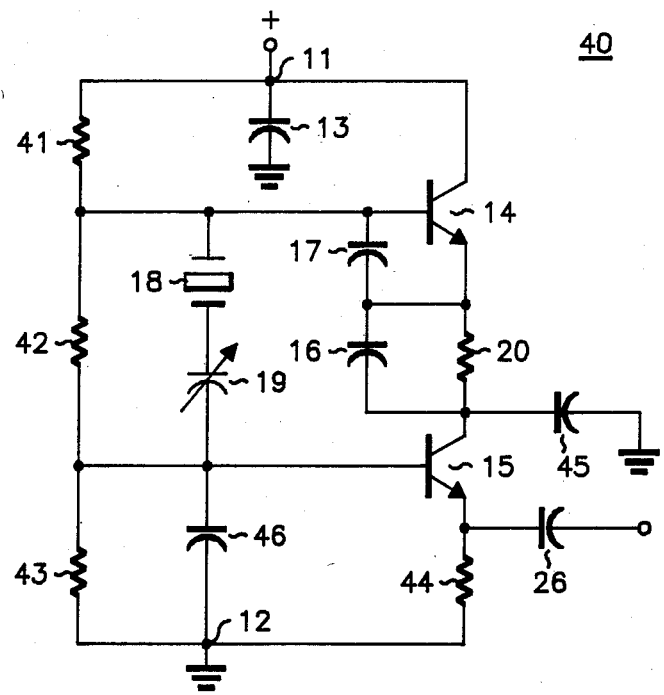
FIG. 4 is a schematic representation of still another variation of an embodiment of the present invention in which a Colpitts oscillator is coupled to a common-collector buffer amplifier output stage.

FIG. 4 illustrates a third embodiment of the present invention showing crystal oscillator/buffer amplifier combination 40 wherein the buffer amplifier is configured as a common-collector (emitter-follower) amplifier stage. Unlike the previous figures, oscillator transistor 14 is located above buffer amplifier transistor 15 in the schematic. Capacitor 45, connected from the collector of transistor 15 to ground, provides an AC ground for the common-collector buffer amplifier, as well as the Colpitts oscillator. The bias voltages for the bases of transistor 14 and 15 are obtained from base bias resistors 41, 42 and 43. The output from the oscillator tank circuit is obtained at trimmer capacitor 19 and fed to the input of the common-collector amplifier at the base of transistor 15. As previously noted, the tank circuit requires a low impedance to ground. The input impedance of a common-collector amplifier stage does not meet this requirement.

The impedance transform network of the C-C buffer includes capacitor 46, which serves the same function as capacitor 33 of the C-E buffer. Accordingly, capacitor 46, connected from the base of transistor 15 to ground, provides the necessary reactance at the crystal oscillator frequency to complete the circulatory tank current paths. The value of capacitor 46 is determined in the same manner as capacitor 33, as previously discussed.

The totem-pole configuration in this embodiment does not require the use of a third series resistor (in the collector of transistor 14) since the DC bias of transistor 15 is provided by resistor 20. Resistor 44 of the emitter-follower buffer controls the current gain of the buffer amplifier. The output of the buffer amplifier stage is obtained from transistor 15 emitter through output coupling capacitor 26.

A representative set of circuit values for the crystal oscillator/buffer amplifier circuit 10 are listed below:

| | |
|---|---|
| Supply Voltage 11 | + 5.0 VDC |
| Capacitor 13 | .01 uF |
| Oscillator transistor 14 | Motorola type MPS6513 |
| Buffer transistor 15 | Motorola type MPS6513 |
| Capacitor 16 | 300 pF |
| Capacitor 17 | 300 pF |
| Crystal 18 (frequency) | 14.4 MHz |
| (resistance $R_S$) | 25 Ohms |
| Trimmer capacitor 19 | 100 pF |
| Resistor 20 | 380 Ohms |
| Resistor 21 | 22K |
| Resistor 22 | 10K |
| Resistor 23 | 12K |
| Capacitor 24 | 1500 pF |
| Resistor 25 | 1.5K |
| Capacitor 26 | 1500 pF |
| Resistor 27 | 150 Ohms |
| Capacitor 28 | 1500 pF |

The common circuit components of the various embodiments as denoted by common reference numerals may have the same value. A representative set of circuit values for the remaining component parts which have been found to provide satisfactory operation are set forth below.

| | |
|---|---|
| Resistor 31 | 150 Ohms |
| Capacitor 32 | 1500 pF |
| Capacitor 33 | 200 pF |
| Resistor 41 | 2.2K |
| Resistor 42 | 10K |
| Resistor 43 | 15K |
| Resistor 44 | 1.2K |
| Capacitor 45 | 1500 pF |
| Capacitor 46 | 200 pF |

The previous three embodiments all pertain to a Colpitts-type crystal oscillator in combination with various types of buffer amplifier stages. It will, of course, be understood that the advantages of the present invention may be obtained through corresponding oscillator configurations, such as Pierce, Hartley, Clapp, and others. Furthermore, the novel concept of the present invention is not limited to the illustrative component values. The concept of the present invention is applicable to numerous types of oscillators, such as modulated oscillators, voltage-controlled oscillators, overtone oscillators, etc. The oscillator may also include additional circuitry for temperature compensation, frequency adjustment, or frequency modulation.

In summary, a low current oscillator/buffer amplifier configuration has been disclosed which provides a simple, inexpensive, low power oscillator with reduced harmonic output. The instant invention is particularly well adapted for use as reference frequency oscillators in portable radio applications.

While specific embodiments of the present invention have been shown and described herein, further modifications and improvements may be made by those skilled in the art. All such modifications which retain the basic underlying principles disclosed and claimed herein are within the scope of this invention.

What is claimed is:

1. A low current oscillator exhibiting a low harmonic output comprising:
   frequency determining means for resonating at a predetermined frequency including a resonant tank circuit;
   first amplifying means having an input port and an output port coupled to said frequency determining means for providing regenerative feedback to enable oscillation;
   second amplifying means having an input port coupled to said frequency determining means and having an output port coupled to a load for providing an amplified oscillation signal; and
   impedance transforming means for
   (a) coupling said frequency determining means to said second amplifying means, and for providing the necessary impedance transformation; and
   (b) coupling said first amplifying means to said second amplifying means in a totem-pole configuration such that a singular primary direct current path exits through said first and second amplifying means.

2. A low current oscillator according to claim 1, wherein said frequency determining means and said first amplifying means form a Colpitts oscillator.

3. A low current oscillator according to claim 1, wherein said frequency determining means further includes a piezoelectric crystal and a plurality of capacitors connected to form said resonant tank circuit.

4. A low current oscillator according to claim 2, wherein said first and second amplifying means each include a bipolar transistor having base, emitter, and collector terminals.

5. A low current oscillator according to claim 4, wherein said second amplifying means forms a common-base amplifier.

6. A low current oscillator according to claim 5, wherein said impedance transforming means includes a first capacitor connected from the base terminal of said common-base amplifier transistor to ground; a second capacitor connected from the collector terminal of said Colpitts oscillator transistor to ground; and a resistor connected between the collector terminal of said Colpitts oscillator transistor and the emitter terminal of said common-base amplifier transistor.

7. A low current oscillator according to claim 4, wherein said second amplifying means forms a common-emitter amplifier.

8. A low current oscillator according to claim 7, wherein said impedance transforming means includes a first capacitor connected from the base terminal of said common-emitter amplifier transistor to ground; a second capacitor connected from the collector terminal of said Colpitts oscillator transistor to ground; and a resistor connected between the collector terminal of said Colpitts oscillator transistor and the emitter terminal of said common-emitter amplifier transistor.

9. A low current oscillator according to claim 4, wherein said second amplifying means forms a common-collector amplifier.

10. A low current oscillator according to claim 9, wherein said impedance transforming means includes a first capacitor connected from the base terminal of said common-collector amplifier transistor to ground; and a second capacitor connected from the collector terminal of said common-collector amplifier transistor to ground.

11. A low current oscillator exhibiting a low harmonic output comprising:

a crystal oscillator circuit including a piezoelectric crystal and a plurality of capacitors connected to form a resonant tank circuit tuned to a predetermined frequency, and further including a first transistor coupled to said tank circuit and connected to form said crystal oscillator circuit, said first transistor having base, collector, and emitter terminals;

a buffer amplifier circuit including a second transistor coupled to said tank circuit and connected to form said buffer amplifier circuit, said second transistor having base, collector, and emitter terminals; and an impedance transforming circuit coupling said crystal oscillator circuit to said buffer amplifier circuit and providing impedance transformation from said resonant tank circuit to said second transistor, and further providing DC biasing of said first transistor and said second transistor in a totem-pole configuration such that a single direct current flows through the collector-emitter path of both transistors.

12. A low current oscillator according to claim 11, wherein said crystal oscillator circuit is configured as a Colpitts oscillator.

13. A low current oscillator according to claim 12, wherein said buffer amplifier circuit is configured as a common-base amplifier.

14. A low current oscillator according to claim 13, wherein said impedance transforming circuit includes a first capacitor connected from the base terminal of said second transistor to ground, a second capacitor connected from the collector terminal of said first transistor to ground, and a resistor connected between the collector terminal of said first transistor and the emitter terminal of said second transistor.

* * * * *